United States Patent
Geng et al.

(10) Patent No.: US 11,895,877 B1
(45) Date of Patent: Feb. 6, 2024

(54) ORGANIC LIGHT-EMITTING DISPLAY PANEL WITH SHIELDING TERMINALS HAVING VARYING WIDTHS, DISPLAY DEVICE, AND METHOD OF PACKAGING DISPLAY PANEL

(71) Applicant: HKC CORPORATION LIMITED, Shenzhen (CN)

(72) Inventors: Miao Geng, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/214,457

(22) Filed: Jun. 26, 2023

(30) Foreign Application Priority Data

Sep. 13, 2022 (CN) .......................... 202211111292.7

(51) Int. Cl.
| H10K 59/126 | (2023.01) |
| H10K 59/70 | (2023.01) |
| H10K 59/40 | (2023.01) |
| H10K 59/131 | (2023.01) |

(52) U.S. Cl.
CPC ......... *H10K 59/126* (2023.02); *H10K 59/131* (2023.02); *H10K 59/40* (2023.02); *H10K 59/70* (2023.02)

(58) Field of Classification Search
CPC .... H10K 59/126; H10K 59/131; H10K 59/40; H10K 59/70
See application file for complete search history.

(56) References Cited

U.S. PATENT DOCUMENTS

| 2011/0229999 A1 | 9/2011 | Park et al. |
| 2013/0038542 A1* | 2/2013 | Kim .......................... G06F 3/041 |
| | | 345/173 |
| 2017/0183767 A1 | 6/2017 | Hong |
| 2018/0053905 A1 | 2/2018 | Lee et al. |
| 2019/0004624 A1* | 1/2019 | Zhu .......................... G06F 3/0445 |

(Continued)

FOREIGN PATENT DOCUMENTS

| CN | 101179093 A | 5/2008 |
| CN | 107342371 A | 11/2017 |

(Continued)

OTHER PUBLICATIONS

Liu, Nian, the ISA written comments, Aug. 2023, CN.
Liu, Nian, the International Search Report, Aug. 2023, CN.

*Primary Examiner* — Lex H Malsawma

(57) ABSTRACT

An organic light-emitting display panel, a display device, and a method of packaging a display panel are disclosed. The organic light-emitting display panel includes a cover plate, a substrate arranged opposite to the substrate, a packaging layer disposed between the cover plate and the substrate, a touch control circuit formed on the cover plate, touch bonding pins disposed at an edge of the cover plate and coupled to the touch circuit, and multiple shielding terminals disposed on both sides of the touch bonding pins. The touch bonding pins and the shielding terminals are disposed corresponding to the packaging layer. A length of each shielding terminal is consistent with a length of each touch bonding pin. Along a direction of getting away from the touch bonding pins, widths of the plurality of shielding terminals gradually decrease.

17 Claims, 3 Drawing Sheets

(56) References Cited

U.S. PATENT DOCUMENTS

2019/0243484 A1\* 8/2019 Tanaka .................... G06F 3/044
2021/0280814 A1   9/2021 Kim et al.

FOREIGN PATENT DOCUMENTS

| CN | 108281569 | A | 7/2018 |
| CN | 208608231 | U | 3/2019 |
| CN | 112662727 | A | 4/2021 |
| CN | 113156727 | A | 7/2021 |
| CN | 113589571 | A | 11/2021 |
| CN | 114200702 | A | 3/2022 |
| CN | 114300597 | A | 4/2022 |
| CN | 216793723 | U | 6/2022 |
| CN | 115202514 | A | 10/2022 |

\* cited by examiner

US 11,895,877 B1

ORGANIC LIGHT-EMITTING DISPLAY PANEL WITH SHIELDING TERMINALS HAVING VARYING WIDTHS, DISPLAY DEVICE, AND METHOD OF PACKAGING DISPLAY PANEL

CROSS-REFERENCE TO RELATED APPLICATIONS

This application claims the priority and benefit of Chinese patent application number 202211111292.7, entitled "Organic Light-emitting Display Panel, Display Device, and Method of Packaging Display Panel" and filed Sep. 13, 2022, with China National Intellectual Property Administration, the entire contents of which are incorporated herein by reference in its entirety.

TECHNICAL FIELD

The present application relates to the field of display technology, and more particularly to an organic light-emitting display panel, a display device, and a method of packaging a display panel.

BACKGROUND

An organic electroluminescent display (Organic Light-Emitting Diode) is a display made of organic electroluminescent light-emitting diodes.

Today, the touch technology of OLED products occupies a large market. In particular, the technology of making the touch sensing circuit on the OLED cover plate is relatively mature. In the current technology where the touch capacitive screen is made on the package, the metal touch lines bonded to the touch region are formed on the cover plate. For hard screens, when the packaging layer is packaged, it will cause uneven laser transmittance and hence uneven sintering, which will lead to problems such as overflow width, air bubbles, and cracks in the packaging layer, which will affect the packaging effect and poor cutting.

At present, by increasing the laser energy or reducing the moving speed of the laser head, laser sintering is performed on the region containing the touch bonding pins to alleviate the problem of uneven sintering. However, if the increased laser energy falls on the reducing the moving speed of the laser head, it cannot be precisely controlled that the energy increase only exists in the touch bonding pin region. Thus, when the laser energy is increased in the normal region, the energy mutation will cause the normal region to form a sudden change in the topography of the packaging layer, which is more likely to cause cracks in the packaging layer, resulting in poor packaging.

SUMMARY

In view of the above, it is therefore one purpose of the present application to provide an organic light-emitting display panel, a display device, and a method of packaging a display panel, which avoid uneven packaging and improve the packaging effect.

The present application discloses an organic light-emitting display panel, including a cover plate, a substrate and a packaging layer. The cover plate is arranged opposite to the substrate. The packaging layer is disposed between the cover plate and the substrate. The organic light-emitting display panel further includes a touch control circuit, and the touch control circuit is formed on the cover plate. The edge of the cover plate is provided with at least one touch bonding pin. The at least one touch bonding pin is coupled to the touch circuit. A plurality of shielding terminals are disposed on both sides of the at least one touch bonding pin. The at least one touch bonding pin and the shielding terminals are disposed corresponding to the packaging layer. The length of each of the plurality of shielding terminals is consistent with the length of the at least one touch bonding pin, and the widths of the plurality of shielding terminals decrease gradually along a direction away from the at least one touch bonding pin.

In some embodiments, the width of each shielding terminal adjacent to the at least one touch bonding pin is equal to the width of the at least one touch bonding pin. The spacing between every two adjacent touch bonding pins is equal. The spacing between every two adjacent shielding terminals is equal. The spacing between every two touch bonding pin and shielding terminal that are adjacent to each other is equal. Along the direction of getting away from the at least one touch bonding pin, the widths of the plurality of shielding terminals decrease gradually by decrements of a first preset value.

In some embodiments, the width of each shielding terminal adjacent to the at least one touch bonding pin is equal to a width of the at least one touch bonding pin. Along the direction of getting away from the at least one touch bonding pin, the widths of the plurality of shielding terminals decrease by decrements a first preset value, the distances between every two adjacent shielding terminals decrease by decrements of a second preset value, where the first preset value is equal to the second preset value.

In some embodiments, the width of each shielding terminal adjacent to the at least one touch bonding pin is equal to the width of the at least one touch bonding pin. Along the direction of getting away from the at least one touch bonding pin, the widths of the plurality of shielding terminals decrease by decrements of a first preset value, and distances between every two adjacent shielding terminals increase by increments of a second preset value, where first preset value is equal to the second preset value.

In some embodiments, the first preset value and the second preset value are each 10 um.

In some embodiments, the material of each shielding terminal is the same as that of the at least one touch bonding pin, and the thickness of each shielding terminal is equal to the thickness of the at least one touch bonding pin.

In some embodiments, of each shielding terminal closest to the at least one touch bonding pin, the side adjacent to the touch bonding pin is a slope, and the slope is greater than or equal to 45° and less than 90°. Each shielding terminal is made of a metal material.

In some embodiments, each shielding terminal is made of a color filter material, and in each shielding terminal adjacent to the at least one touch bonding pin, the light transmittance decreases along an inclination direction of the slope.

In some embodiments, the touch control circuit and the at least one touch bonding pin are formed on a side of the cover plate away from the substrate.

The present application further discloses a display device, which includes an outer cover plate and the above-mentioned organic light-emitting display panel, where the outer cover plate is arranged on the side of a light-emitting surface of the organic light-emitting display panel.

The present application further discloses a method of packaging a display panel, which is used for packaging the above-mentioned organic light-emitting display panel, the method including the following operations:

coating a packaging layer at an edge position between the cover plate and the substrate;

performing laser sintering on the packaging layer of the display panel along a preset path using laser equipment;

in response to detecting that the laser device has moved to a normal region, sintering the packaging layer in the normal region according to a first preset laser energy and a first preset moving speed;

in response to detecting that the laser device has moved to a buffer region, gradually increasing the laser energy and/or gradually reducing the moving speed is to sinter the packaging layer in the buffer region; and in response to detecting that the laser device has moved to the touch bonding pin region, increasing the laser energy to sinter the packaging layer in a touch bonding pin region;

wherein touch bonding pins and shielding terminals located on both sides of the touch bonding pins are formed on the cover plate; wherein laser sintering ratios of the normal region, the buffer region and the touch bonding pin region of the laser device are equal.

Compared with the solution of laser sintering the region containing the touch bonding pins by increasing the laser energy or reducing the moving speed of the laser head, this application arranges a plurality of shielding terminals on both sides of the touch bonding pin, where the length of the plurality of shielding terminals is consistent with the length of the touch bonding pin, and along the direction of getting away from the touch bonding pin, the widths of the plurality of shielding terminals decrease gradually. In this way, when performing laser irradiation, the energy of the laser head can be controlled to be changed or the speed of the laser head can be changed starting in the region where the shielding terminals are disposed, and the shielding terminals whose widths decrease along the direction of getting away from the touch bonding pin can be used to realize an energy buffering effect in the regions where the shielding terminals are present, so as to avoid a large difference caused by a sudden change in laser energy thus leading to the problem that the junction between the region of non-touch bonding pins and the region of touch bonding pins 141 is prone to uneven packaging caused by a large difference of energy mutation.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

Figure 1:
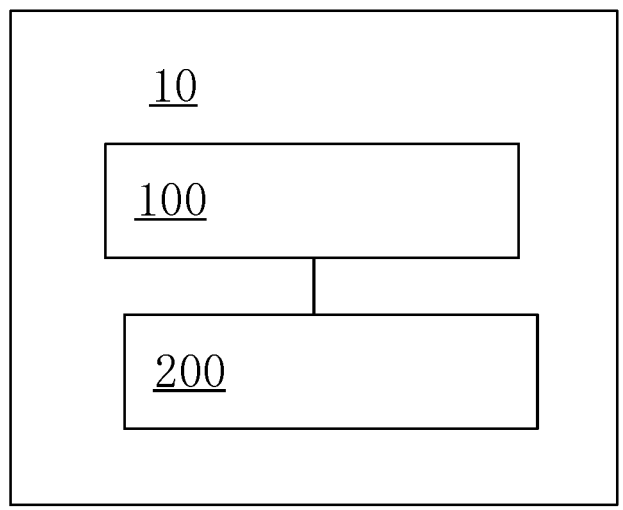
FIG. 1 is a block diagram of a display device according to the present application.

In the drawings: 10, display device; 100, organic light-emitting display panel; 110, cover plate; 120, substrate; 130, packaging layer; 140, touch circuit; 141, touch bonding pin; 150, shielding terminal; 151, slope; 160, normal region; 170, buffer region; 180, touch bonding pin region; 190, inorganic layer; 200, outer cover plate.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. Term "comprising", "including", and any variants thereof mean non-exclusive inclusion, so that one or more other features, integers, steps, operations, units, components, and/or combinations thereof may be present or added.

Figure 2:
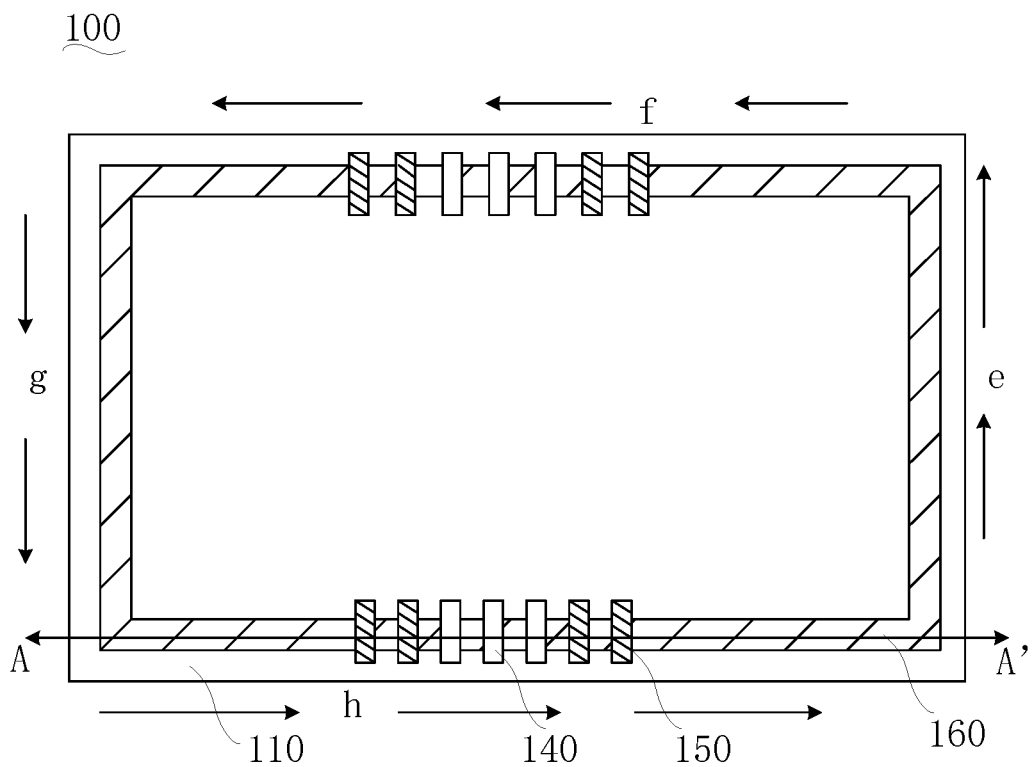
FIG. 2 is a schematic diagram of an organic light-emitting display panel according to the present application.
Figure 3:
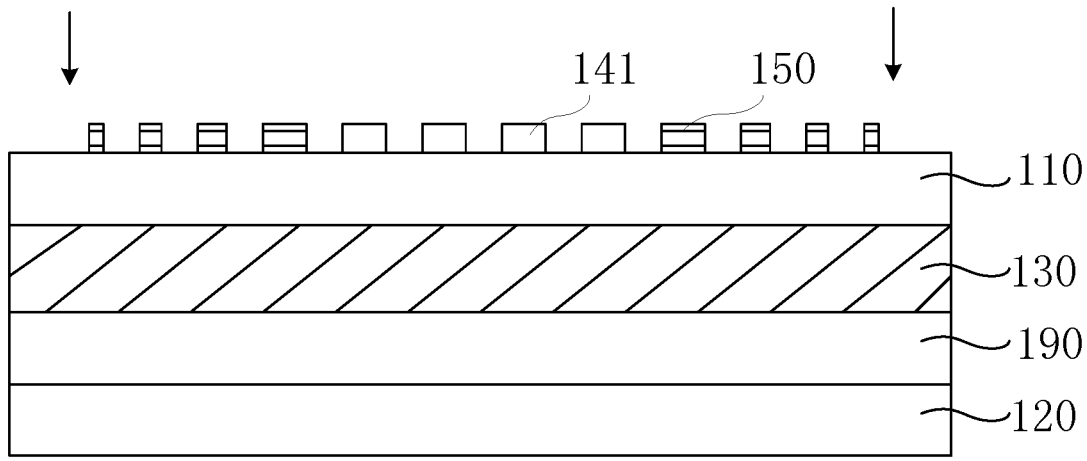
FIG. 3 is a schematic cross-sectional diagram of FIG. 2 along the section line A-A'.
Figure 4:
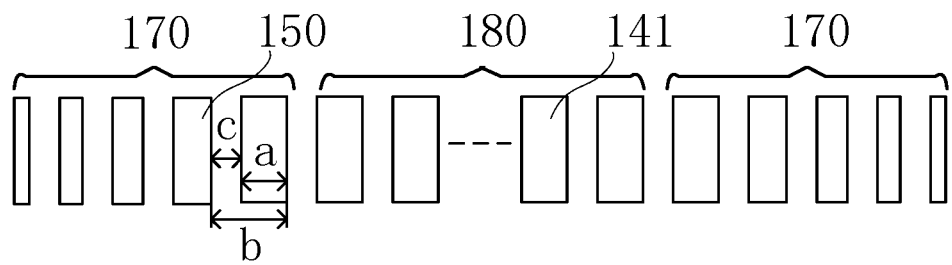
FIG. 4 is a schematic diagram of an arrangement of shielding terminals provided by a first embodiment according to the present application.
Figure 5:
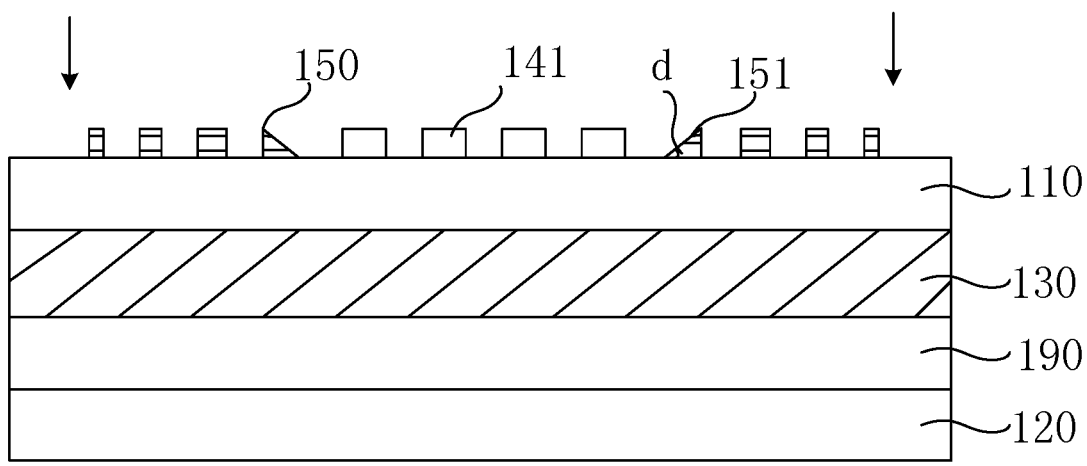
FIG. 5 is a schematic cross-sectional diagram of an organic light-emitting display panel provided in a second embodiment according to the present application.

FIG. 1 is a schematic block diagram of a display device according to the present application. FIG. 2 is a schematic diagram of an organic light-emitting display panel according to the present application. FIG. 3 is a schematic cross-sectional diagram of FIG. 1 along the section line A-A'. FIG. 4 is a schematic diagram of an arrangement of touch bonding pins and shielding terminals in this application. As shown in FIG. 1, the present application discloses a display device 10, including an outer cover plate 200 and an organic light-emitting display panel 100. The outer cover plate 200 is disposed on one side of the organic light-emitting display panel 100. In particular, as can be seen from FIGS. 2-3, the organic light-emitting display panel 100 includes a cover plate 110, a substrate 120 and a packaging layer 130. The cover plate 110 is arranged opposite to the substrate 120. The packaging layer 130 is disposed between the cover plate 110 and the substrate 120. The organic light-emitting display panel 100 further includes a touch circuit 140. The touch circuit 140 is formed on the cover plate 110. The edge of the cover plate 110 is provided with at least one touch bonding pin 141. The at least one touch bonding pin 141 is coupled to the touch circuit 140, and the two sides of the at least one touch bonding pin 141 are respectively provided with a plurality of shielding terminals 150. The length of each of the plurality of shielding terminals 150 is consistent with the length of the at least one touch bonding pin 141, and in the direction of getting farther away from the at least one touch bonding pin 141, the widths of the plurality of shielding terminals 150 decrease gradually.

Compared with the solution of laser sintering the region 180 containing the touch bonding pins by increasing the laser energy or reducing the moving speed of the laser head, this application arranges a plurality of shielding terminals 150 on both sides of the at least one touch bonding pin 141, where the length of the plurality of shielding terminals 150 is consistent with the length of the at least one touch bonding pin 141, and along the direction of getting away from the touch bonding pin 141, the widths of the plurality of shielding terminals 150 decrease gradually. In this way, when performing laser irradiation, the energy of the laser head can be slowly increased or the speed of the laser head can be slowly slowed down starting in the region where the shielding terminals 150 are set, and the shielding terminals 150 whose widths decrease along the direction of getting away from the at least one touch bonding pin 141 can be used to realize an energy buffering effect in the regions where the shielding terminals 150 are present, so as to avoid a large difference caused by a sudden change in laser energy thus leading to the problem that the junction between the region of non-touch bonding pins 141 and the region of touch bonding pins 141 is prone to uneven packaging caused by a large difference of energy mutation.

The packaging layer 130 is glass glue. Because the glass glue itself has certain stability and poor fluidity, it is easier to take shape when coating and packaging, and it can also deform after absorbing heat for attaching and adsorption, hence good packaging effect. Of course, other suitable packaging materials can also be used for packaging, as long as the packaging effect and stability can be guaranteed.

Hereinafter this application will be described in further detail with reference to the accompanying drawings and some optional embodiments.

Embodiment 1

The direction of the arrow shown in FIG. 2 indicates the direction of a preset path of the laser head. The direction of the arrow shown in FIG. 3 is an irradiation direction of the laser light. As shown in FIGS. 2-3, the region where the touch bonding pins 141 are disposed is the touch bonding pin region 180, the region provided with the shielding terminals 150 is the buffer region 170, and the region without the touch bonding pins 141 and the shielding terminals 150 is the normal region 160. During packaging, the laser light performs sintering and packaging around the edge of the packaging layer 130 along the normal region 160, the buffer region 170 and the touch bonding pin region 180 of the display panel.

As shown in FIG. 2, the organic light-emitting display panel has four sides, respectively e, f, g and h. The lengths of the touch bonding pins and the shielding terminals are measured extending in a direction parallel to e and g are their lengths, and the widths of the touch bonding pins and the shielding terminals extending along the direction f and h, are their widths.

As shown in FIG. 4, the width of the shielding terminal 150 is represented by a. For two adjacent shielding terminals 150, the distance from the side of the first shielding terminal 150 away from the second shielding terminal 150 to the side of the second shielding terminal 150 adjacent to the first shielding terminal 150 is represented by b. The distance between two adjacent shielding terminals 150 is denoted by c.

As shown in FIG. 3, the width of the shielding terminal 150 adjacent to the touch bonding pin 141 is equal to the width of the touch bonding pin 141. The spacing between adjacent touch bonding pins 141 is equal. The spacing between adjacent shielding terminals 150 is equal. The spacing between the touch bonding pin 141 and the shielding terminal 150 that are adjacent to each other is equal. Along the direction of getting away from the touch bonding pin 141, the widths of the plurality of shielding terminals 150 decrease gradually according to a first preset value. In this way, the arrangement intervals of the plurality of touch bonding pins and the plurality of shielding terminals are equal and uniform. The first preset value is 10 um. That is, along the direction of getting away from the touch bonding pin 141, under the condition that the distance c between two adjacent shielding terminals 150 remains unchanged, a is gradually decreased by the first preset value at the same time. For example: starting from the shielding terminal 150 closest to the touch bonding pin 141, for adjacent shielding terminals 150, the distance b from the side of the first shielding terminal 150 away from the second shielding terminal 150 to the side of the second shielding terminal 150 adjacent to the first shielding terminal 150 is 250 um, the width a of the first shielding terminal 150 is 130 um, the distance c between the first shielding terminal 150 and the second shielding terminal 150 is 120 um, then in this case a is reduced according to the first preset value of 10 um. That is, the width a of the second shielding terminal 150 is 130 um-10 um=120 um. The width a of the third shielding terminal 150 is 120 um-10 um=110 um, then b is the sum of the width of the second shielding terminal 150 plus the distance between the second shielding terminal 150 and the third shielding terminal 150, namely 120 um+120 um=240 um. That is, the distance b from the second shielding terminal 150 to the third shielding terminal 150 is 250 um-10 um=240 um. By analogy, for adjacent shielding terminals 150, b and a are simultaneously arranged in such a way as to descrease by the first preset value. In this case, along the direction of getting away from the touch bonding pin 141, the arrangement between every two adjacent shielding terminals 150 is uniform in proportion.

When the laser light of the laser head performs laser packaging on the region of the packaging layer 130 along the preset path, when it reaches the buffer region 170, the widths of two adjacent shielding terminals 150 increase gradually along the direction adjacent to the touch bonding pin 141. When controlling the laser head to increase energy slowly, since energy is equal to power multiplied by time, if the moving speed of the laser head remains unchanged in this case (that is, the time remains unchanged), then along the preset path, when the power of the laser head increases slowly, the energy of the laser head reaching the touch pin region increases gradually. When reaching the touch bonding pin region 180, the laser light of the laser head is at its maximum. However, since the process of increasing the laser energy of the laser head is a process of gradual and slow increase, and due to the existence of evenly arranged shielding terminals 150, the energy of laser light irradiating each region with a shielding terminal 150 is almost the same during the movement of the laser head. That is, the heat absorbed by the glass glue from laser light is the same. Therefore, in the packaging process, the region of the non-touch bonding pins will not have a large energy difference due to the sudden change of laser light energy, which may otherwise cause uneven packaging. Furthermore, when the laser light reaches the region of the touch bonding pin 141, the energy is also increased as preset to reach the energy value capable of firmly packaging the touch bonding pin region 180. Therefore, the entire packaging process can be made uniform and stable, and the problem of uneven packaging can be avoided.

On the contrary, when the laser light moves from the touch bonding pin region 180 to the normal region 160, the laser light energy of the laser head is gradually reduced. In this case, by slowly reducing the energy in the buffer region 170, it is possible to avoid changes and cracks etc. in the topography of the packaging layer 130 caused by sudden changes in energy, and the sealing ratio of each region in the entire packaging process is made the same as much as possible, so as to improve the overall packaging effect and achieve a high packaging strength.

Similarly, when the moving speed of the laser head is reduced, the energy accumulation can also be increased due to the longer moving time, and a uniform packaging effect can also be achieved. In addition, while the laser light energy of the laser head is changing, it is also possible to reduce the moving speed of the laser head in combination, where the specific setting and cooperation can be carried out according to the situation, and details are not to be described here.

In addition, in this embodiment, along the direction of getting away from the touch bonding pin 141, while the widths of the plurality of shielding terminals 150 are decreased by the first preset value, the distances between two adjacent shielding terminals 150 can also be decreased by a second preset value at the same time, where the first preset value may be equal to the second preset value. That is, the plurality of the shielding terminals 150 are arranged in such a manner that the widths of the shielding terminals 150 and the distance between two adjacent shielding terminals 150 are arranged in descending order by decrements of the same preset value. In this case, a is reduced by the first preset value of 10 um, that is, the width a of the second shielding terminal 150 is 130 um-10 um=120 um, and the width a of the third shielding terminal 150 is 120 um-10 um=110 um. The distance c between the second shielding terminal 150 and the third shielding terminal 150 is reduced by the second preset value of 10 um, which is 120 um-10 um=110 um. Then in this case b is the sum of the width of the second shielding terminal 150 plus the distance between the second shielding terminal 150 and the third shielding terminal 150, namely 120 um+110 um=230 um. That is, b is 250 um-20 um=230 um. By analogy, by arranging the plurality of shielding terminals 150 in such a descending manner, since the decreasing value of b is slightly larger, in this case, the shielding terminals 150 are relatively densely arranged. Thus, one or two more shielding terminals 150 can be arranged in the buffer region 170, and the descending arrangement of the shielding terminals 150 is also relatively uniform, which can also achieve a more uniform packaging effect during laser irradiation.

Of course, along the direction of getting away from the touch bonding pin 141, it is also possible that the widths of the plurality of shielding terminals 150 decrease gradually by decrements of the first preset value, and the distances between two adjacent shielding terminals 150 increase by a second preset value, where the first preset value is equal to the second preset value, so that the plurality of shielding terminals 150 can also be arranged in descending widths. Then, in this case, the spacing between every two shielding terminals 150 is relatively wide, that is, the plurality of shielding terminals 150 are arranged sparsely. When the laser is irradiated, the energy of the laser light passing through every two shielding terminals 150 and irradiating the packaging layer 130 is more, and so the packaging layer 130 absorbs th energy and has a relatively better packaging effect with the cover plate 110 and the substrate 120. However, since the shielding terminals 150 are still arranged in descending order along the direction of getting away from the touch bonding pin 141, by the cooperation with the laser head, the energy or moving speed of the laser head can still be controlled to make the packaging uniformity better.

The material of the shielding terminal 150 is the same as that of the touch bonding pin 141, and the thickness of the shielding terminal 150 is equal to the thickness of the touch bonding pin 141. The same material can be processed by the same manufacturing procedure, thus saving materials and reducing process. The same thickness is adopted, so that when the laser is illuminated, the transmittance of the laser light through the shielding terminal 150 is consistent with that through the touch bonding pin 141, thus avoiding the problem of uneven packaging of the packaging layer 130 caused by uneven transmittance resulting in different light heat absorbed by the packaging layer 130.

In this embodiment, the shielding terminal 150 may be a metal material. Since the touch bonding pin 141 may be made of metal material, the uniformity of light blocking can be achieved. Furthermore, it is relatively easy to control if the energy is increased during laser irradiation, and the energy can be increased in the same proportion. Of course, the shielding terminal 150 can also be made of a black matrix or a transparent electrode or a color filter material, then the material of the shielding terminal 150 is different from that of the touch bonding pin 141. This is beneficial for the device to detect and identify the touch bonding pin region 180, the buffer region 170 and the normal region 160, thus better controlling the moving speed or energy of the laser head, make the packaging better.

As shown in FIG. 3, the organic light-emitting display panel 100 further includes an inorganic layer 190 disposed between the packaging layer 130 and the substrate 120. It is also possible to coat the packaging layer 130 after the inorganic layer 190 is first formed on the substrate 120.

Embodiment 2

FIG. 4 is a schematic diagram of an arrangement of shielding terminals provided by a second embodiment according to the present application. As shown in FIG. 4, the difference between this embodiment and the first embodiment is that the shielding terminal 150 closest to the touch bonding pin 141 has a slope 151 on a side adjacent to the touch bonding pin 141, that is, the shielding terminal 150 has a triangular structure. When the shielding terminal 150 is made of a metal material, the metal material itself has the function of blocking light namely it also has the function of reflecting light to a certain extent. By designing the side adjacent to the touch bonding pin 141 as a slope 151, part of the laser light can be properly reflected, and part of the laser light can be reflected from the slope 151 to the packaging layer 130 corresponding to the touch bonding pin region 180, so that the heat of laser light absorbed by the packaging layer 130 at this position can be increased, thereby increasing the packaging adhesive force of the packaging layer 130 at this position, achieving an ideal uniform packaging effect.

The included angle between the slope 151 and the side of the cover plate is d. The slope of the slope 151 is greater than or equal to 45° and less than 90°, that is, 45°≤d<90°. When the slope of the slope 151 is larger, the laser light can be reflected to the touch bonding pin region 180 relatively more. Furthermore, in this case, due to the existence of the slope 151, the laser light can be reflected to the touch bonding pin 141 and then reflected and refracted into the region corresponding to the touch bonding pin 141.

In order to reflect more laser light energy, a reflective material may also be disposed on the slope 151, so that more laser light energy can be reflected to the packaging layer 130 corresponding to the touch bonding pin region 180 in combination with the slope of the slope 151, so that the packaging layer 130 in this region can absorb more laser light energy, thereby improving the packaging adhesion of the packaging layer 130 in this region.

When the shielding terminal 150 is made of a black matrix or a transparent electrode or a color filter material, the light transmittance of the slope 151 can be gradually decreased along the inclined direction of the slope 151. That is, the closer to the cover plate 110, the lower the light transmittance of the shielding terminal 150 having the slope 151. In this way, the light transmittance is designed differently, and the energy absorption at this position can also be made uniformly when the laser is illuminated, so that the energy mutation at this position is also a process of gradual increase or decrease, so that it is not easy to cause the sudden change in energy at this position to be too large thus resulting in a significant sudden change in the topography of the packaging layer 130 and affecting the packaging effect. Of course, when the shielding terminal 150 uses a semi-transparent material, the thickness of the shielding terminal 150 can be set to be thicker than the thickness of the touch bonding pin 141, so as to enhance the light-shielding ability of the shielding terminals 150, making the laser light energy absorbed by the buffer region 170 consistent with that absorbed by the touch bonding pin region 180 and the normal region 160 as much as possible, so as to avoid the sudden change in the topography of the packaging layer 130.

In addition, in this embodiment, the shielding terminal 150 closest to the touch bonding pin 141 can also be other structures with a slope 151. For example: the slope 151 can be arc-shaped, and the arc-shaped arc surface faces the touch bonding pin 141, which is beneficial to the reflection of laser light. Alternatively, the shielding terminal 150 can also be a rectangular structure with a slope 151, which can be set according to the actual situation, and at the same time cooperate with the energy or moving speed of the laser light of the laser head to achieve better packaging uniformity.

Figure 6:
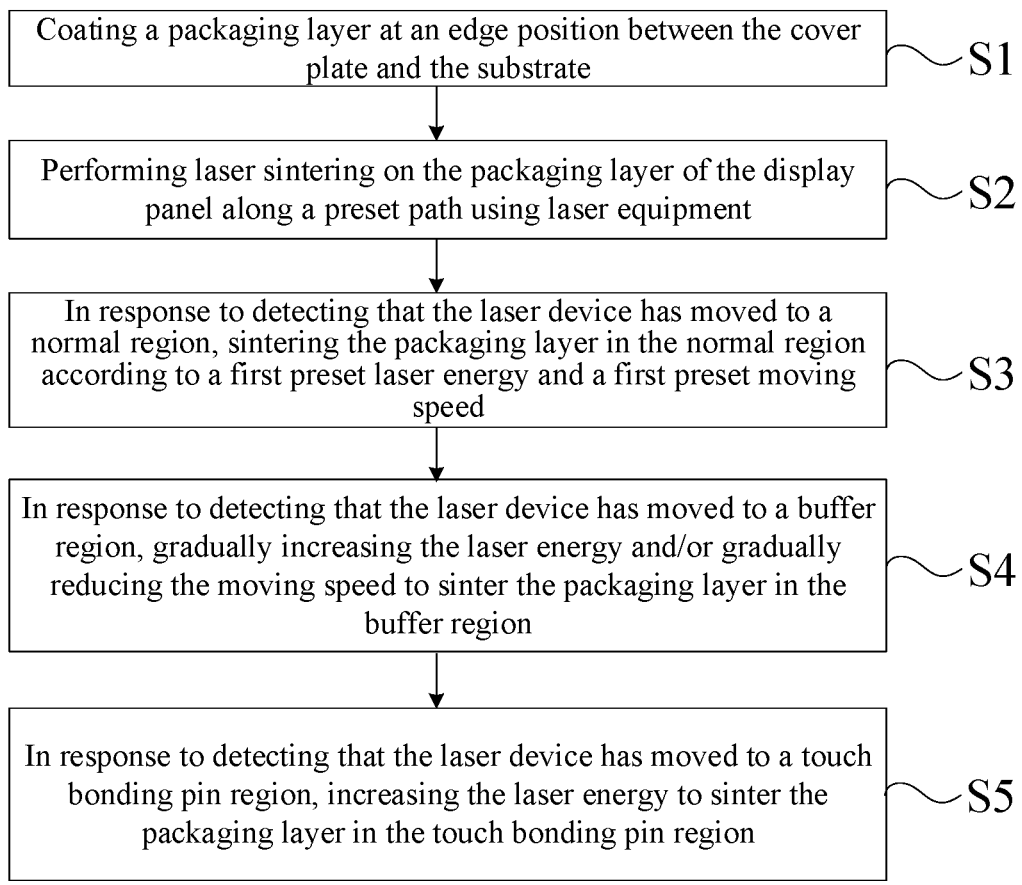
FIG. 6 is a flowchart of a method of packaging a display panel according to the present application.

FIG. 6 is a flow chart of a method of packaging a display panel according to the present application. As shown in FIG. 6, the present application further discloses a method of packaging a display panel, which is used for packaging the above-mentioned organic light-emitting display panel, the method including the following operations:

S1: between the cover plate and the substrate, coating the packaging layer at the corresponding edge position;

S2: laser sintering the packaging layer of the display panel along a preset pathby using laser equipment;

S3: when it is detected that the laser device moves to the normal region, sintering the packaging layer in the normal region according to a first preset laser energy and a first preset moving speed;

S4: when it is detected that the laser equipment moves to the buffer region, gradually increasing the laser energy and/or gradually reducing the moving speed to sinter the packaging layer in the buffer region;

S5: when it is detected that the laser device moves to the touch bonding pin region, increasing the laser energy to sinter the packaging layer in the touch bonding pin region;

where touch bonding pins and shielding terminals located on both sides of the touch bonding pins are formed on the cover plate; the laser sintering ratio of the laser device in the normal region, the buffer region and the touch bonding pin region is the same, so that the packaging region of the display panel is evenly packaged after packaging.

In addition, in step 5, the moving speed of the laser head can also be reduced in cooperation with with the light-shielding terminals to make the packaging effect better and the uniformity better. Of course, the laser energy change and the moving speed change of the laser head can also be carried out simultaneously.

It should be noted that the inventive concept of the present application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

It should be noted that the limitations of various operations involved in this solution will not be deemed to limit the order of the operations, provided that they do not affect the implementation of the specific solution, so that the operations written earlier may be executed earlier or they may also be executed later or even at the same time. As long as the solution can be implemented, they should all be regarded as falling in the scope of protection of this application.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. An organic light-emitting display panel, comprising:
   a cover plate;
   a substrate, arranged opposite to the cover plate;
   a packaging layer, arranged between the cover plate and the substrate;
   a touch control circuit formed on the cover plate;
   at least one touch bonding pin, disposed at an edge of the cover plate and coupled to the touch control circuit; and
   a plurality of shielding terminals, disposed on both sides of the at least one touch bonding pin; wherein the at least one touch bonding pin and the plurality of shielding terminals are disposed corresponding to the packaging layer;
   wherein a length of each of the plurality of shielding terminal is equal to a length of the at least one touch bonding pin, and wherein widths of the plurality of shielding terminals decrease gradually along a direction of getting farther away from the at least one touch bonding pin.

2. The organic light-emitting display panel as recited in claim 1, wherein a width of each shielding terminal adjacent to the at least one touch bonding pin is equal to a width of the at least one touch bonding pin;
   wherein a spacing between every two adjacent touch bonding pins is equal, a spacing between every two adjacent shielding terminals is equal, and a spacing between every touch bonding pin and the corresponding adjacent shielding terminal is equal, and wherein the widths of the plurality of shielding terminals decrease by decrements of a first preset value along the direction of getting farther away from the at least one touch bonding pin.

3. The organic light-emitting display panel as recited in claim 1, wherein a width of each shielding terminal adjacent to the at least one touch bonding pin is equal to a width of the at least one touch bonding pin; wherein in the direction of getting farther away from the at least one touch bonding pin, the widths of the plurality of shielding terminals decrease by decrements of a first preset value, and distances between every two adjacent shielding terminals decrease by decrements of a second preset value, wherein the first preset value is equal to the second preset value.

4. The organic light-emitting display panel as recited in claim 3, wherein the first preset value and the second preset value are each 10 um.

5. The organic light-emitting display panel as recited in claim 1, wherein a width of each shielding terminal adjacent to the at least one touch bonding pin is equal to a width of the at least one touch bonding pin;
wherein along the direction of getting away from the at least one touch bonding pin, the widths of the plurality of shielding terminals decrease by decrements of a first preset value, and distances between every two adjacent shielding terminals increase by increments of a second preset value, wherein the first preset value is equal to the second preset value.

6. The organic light-emitting display panel as recited in claim 5, wherein the first preset value and the second preset value are each 10 um.

7. The organic light-emitting display panel as recited in claim 1, wherein a material of each of the plurality of shielding terminals is the same as that of the at least one touch bonding pin, and wherein a thickness of each of the plurality of shielding terminals is equal to a thickness of the at least one touch bonding pin.

8. The organic light-emitting display panel as recited in claim 7, wherein of each shielding terminal adjacent to the at least one touch bonding pin, a side adjacent to the at least one touch bonding pin is a slope, which is greater than or equal to 45° and less than 90°;
wherein each of the plurality of shielding terminals is made of a metal material.

9. The organic light-emitting display panel as recited in claim 8, wherein the plurality of shielding terminals are each made of a color filter material, and wherein in each shielding terminal adjacent to the at least one touch bonding pin, a light transmittance gradually decreases along an inclination direction of the slope.

10. The organic light-emitting display panel as recited in claim 8, wherein a reflective material is disposed on the slope.

11. The organic light-emitting display panel as recited in claim 8, wherein a thickness of each of the plurality of shielding terminals is greater than a thickness of the at least one touch bonding pin.

12. The organic light-emitting display panel as recited in claim 8, wherein the slope is arc-shaped, and wherein the arc-shaped arc surface faces the at least one touch bonding pin.

13. The organic light-emitting display panel as recited in claim 8, wherein each of the plurality of shielding terminals is a rectangular structure with a slope.

14. The organic light-emitting display panel as recited in claim 8, wherein a material of each of the plurality of shielding terminals is different than that of the at least one touch bonding pin, wherein each of the plurality of shielding terminals is made of a black matrix material.

15. The organic light-emitting display panel as recited in claim 1, further comprising an inorganic layer disposed between the packaging layer and the substrate.

16. A display device, comprising an outer cover plate and an organic light-emitting display panel, wherein the outer cover plate is arranged on a side of a light-emitting surface of the organic light-emitting display panel; wherein the organic light-emitting display panel, comprises:
a cover plate;
a substrate, arranged opposite to the cover plate;
a packaging layer, arranged between the cover plate and the substrate;
a touch control circuit formed on the cover plate;
at least one touch bonding pin, disposed at an edge of the cover plate and coupled to the touch control circuit; and
a plurality of shielding terminals, disposed on both sides of the at least one touch bonding pin; wherein the at least one touch bonding pin and the plurality of shielding terminals are disposed corresponding to the packaging layer;
wherein a length of each of the plurality of shielding terminals is equal to a length of the at least one touch bonding pin, and wherein widths of the plurality of shielding terminals decrease gradually along a direction of getting farther away from the at least one touch bonding pin.

17. A method of packaging a light-emitting display panel, the organic light-emitting display comprises: a cover plate; a substrate, arranged opposite to the cover plate; a packaging layer, arranged between the cover plate and the substrate; a touch control circuit formed on the cover plate; at least one touch bonding pin, disposed at an edge of the cover plate and coupled to the touch control circuit; and a plurality of shielding terminals, disposed on both sides of the at least one touch bonding pin; wherein the at least one touch bonding pin and the plurality of shielding terminals are disposed corresponding to the packaging layer;
wherein a length of each of the plurality of shielding terminals is equal to a length of the at least one touch bonding pin, and wherein widths of the plurality of shielding terminals decrease gradually along a direction of getting farther away from the at least one touch bonding pin;
wherein the method comprises the following operations:
coating a packaging layer at an edge position between the cover plate and the substrate;
performing laser sintering on the packaging layer of the display panel along a preset path using laser equipment;
in response to detecting that the laser equipment has moved to a normal region, sintering the packaging layer in the normal region according to a first preset laser energy and a first preset moving speed;
in response to detecting that the laser equipment has moved to a buffer region, gradually increasing the laser energy and/or gradually reducing the moving speed to sinter the packaging layer in the buffer region; and
in response to detecting that the laser equipment has moved to a touch bonding pin region, increasing the laser energy to sinter the packaging layer in the touch bonding pin region;
wherein the at least one touch bonding pin and the plurality of shielding terminals located on both sides of the at least one touch bonding pin are formed on the cover plate; wherein laser sintering ratios of the normal region, the buffer region and the touch bonding pin region of the laser equipment are equal.

\* \* \* \* \*